May 7, 1974 R. E. BROWN ET AL 3,809,625

METHOD OF MAKING CONTACT BUMPS ON FLIP-CHIPS

Filed Aug. 15, 1972

United States Patent Office 3,809,625
Patented May 7, 1974

3,809,625
METHOD OF MAKING CONTACT BUMPS ON FLIP-CHIPS

Ronald E. Brown and James A. Oakes, Kokomo, Ind., assignors to General Motors Corporation, Detroit, Mich.

Filed Aug. 15, 1972, Ser. No. 280,795
Int. Cl. C23b *5/48*; H01l *3/00*
U.S. Cl. 204—15 5 Claims

ABSTRACT OF THE DISCLOSURE

A method of forming integral ohmic leads on a semiconductor device which includes the process of selectively electrodepositing collapsible and noncollapsible contact bumps on a blanket chromium layer without masking the chromium layer.

BACKGROUND OF THE INVENTION

This invention relates to semiconductor devices and more particularly to an improved process for making integral ohmic contacts on such devices. More specifically, it involves a process for making contact bumps on flip-chips. With increased miniaturization of semiconductor devices the formation of reliable integral ohmic contacts becomes increasingly difficult. The integral leads are usually multilayered and require the use of a plurality of succesive masks that must be precisely registered. The integral leads should be made in such a way as to insure that the active surface of the semiconductor wafer is reliably sealed from outside impurities both during and after formation of the integral leads. The masks used must be carefully applied with extremely accurate registration. This is both costly and time consuming. Moreover, each additional mask needed in the process adds another risk of yield loss on the process and reduction in reliability of the finished product. It is, therefore, desirable to eliminate as many of the masking steps as possible. An improved process would result.

OBJECTS AND SUMMARY OF THE INVENTION

It is an object of this invention to provide an improved method for making integral ohmic contacts on semi-conductor devices which is more economical and increases yields and reliability. More specifically, it is an object of this invention to provide a method of making contact bumps on an integrated circuit wafer without the requirement of a mask during deposition and overplating of the contact bumps.

The invention comprehends a process for making collapsible and noncollapsible contact bumps on a semiconductor wafer by forming a metallization pattern on the surface of an oxide coated semiconductor wafer having at least one active device formed in it. The metallization pattern contacts selected regions of the device through windows in the oxide coating. A continuous or blanket film of glass is formed over the metallization pattern, with holes in the glass film over contact pads in the pattern. A blanket layer of chromium is deposited over the glass layer. Contact pads of a selected metal are formed on the chromium layer over the holes in the glass. The wafer is then placed unmasked in a plating bath for selectively depositing bump metal onto the pads but not onto the chromium layer exposed outside the pads. Electrodeposition is continued until a sufficient bump thickness is obtained on the pads. After the bumps are formed the exposed portions of the chromium layer are removed. The wafer is immersed in a selective etchant that attacks the exposed chromium but not the bump and pad metals. Etching is continued until all the chromium is etched away except under the contact bumps.

BRIEF DESCRIPTION OF THE DRAWING

Other objects, features and advantages of the invention will become more apparent from the following description of preferred embodiments thereof and from the drawing, in which.

DESCRIPTION OF THE PREFERRED EMBODIMENTS

Figures 1, 2, 3, 4, 5, 6, 7, 8:
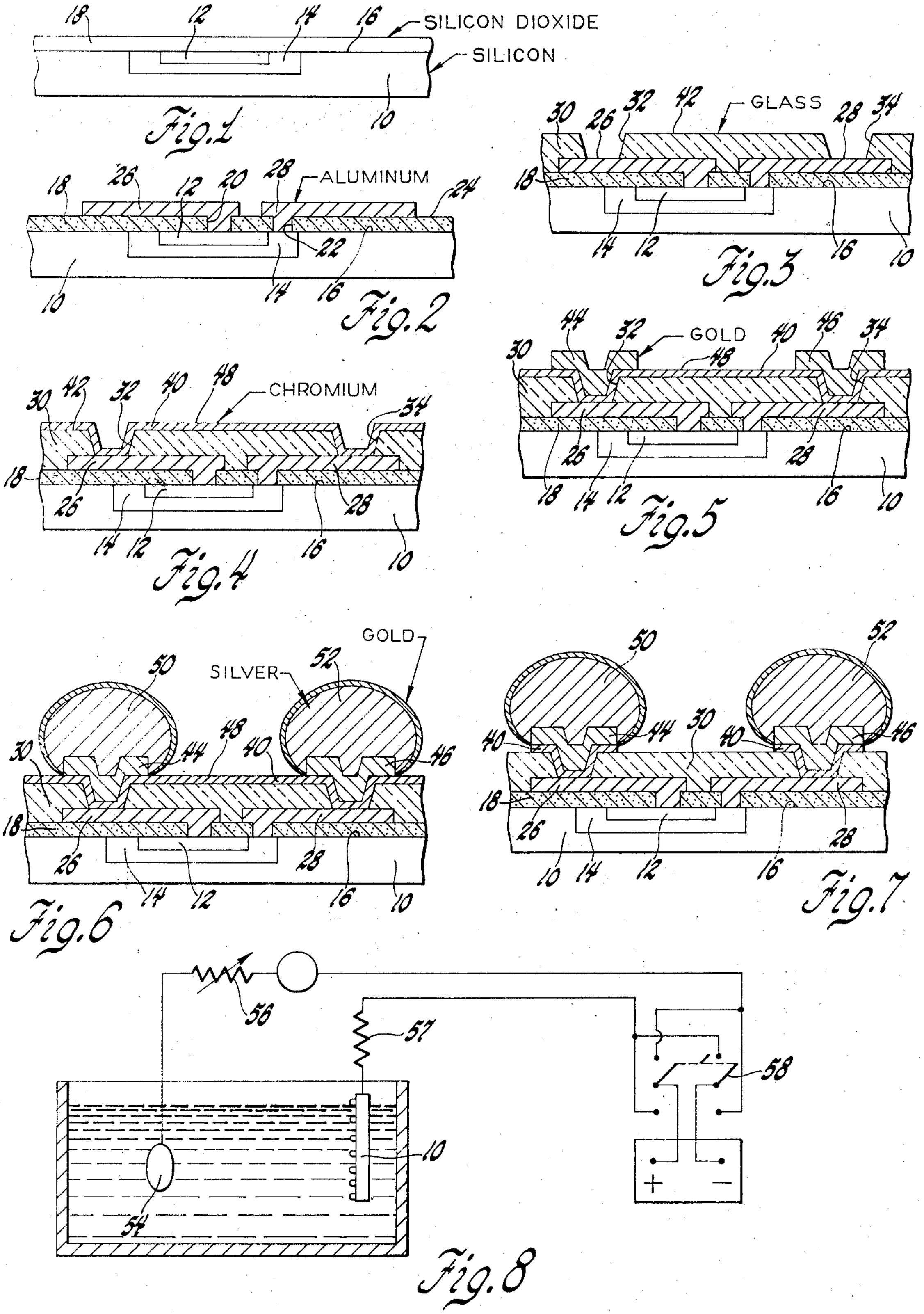
FIGS. 1 through 7 are selected fragmentary cross-sectional views showing a semiconductor wafer during the various successive steps of the process this invention comprehends.
FIG. 8 shows a schematic view of an apparatus which can be used to electrodeposit silver contact bumps in accordance with the invention.

This invention is most applicable but not restricted to planar semiconductor devices such as shown in connection with FIG. 1. Such devices, for example, would include an N-type semiconductor wafer portion 10 having an N-type diffusion region 12 inset within a P-type diffusion region 14 that is inset on wafer surface 16. This process would normally be used on a wafer containing hundreds of sites upon which contact bumps are desired. For convenience, the drawing shows merely two such sites on a fragmentary part of a large wafer. Surface 16 of the wafer 10 has a protective coating 18 of silicon dioxide or the like. Coating 18 typically is produced during the diffusion treatments in which inset regions 12 and 14 are formed. It can be a thermally grown silicon dioxide coating of approximately 8,000 to 15,000 angstroms in thickness.

Windows 20 and 22 are opened in the oxide coating 18 and an aluminum metallization pattern formed on the surface 24 of the oxide. Portions 26 and 28 of the metallization pattern contact regions 12 and 14, respectively, of the wafer 10 through windows 20 and 22 in the oxide coating 18. Windows 20 and 22 are formed in the usual manner, as for example by selective etching. In such instance a photoresist material (not shown) is applied to the surface 24 of the oxide layer to form an etching mask. A photoresist material is one which upon exposure to light becomes insoluble with respect to certain etchants and solvents. Any photoresist material can be used, with typical materials being KMER aand KPR which are obtainable from the Eastman Kodak Company. The invention shall be described in connection with KMER. The KMER is applied as a continuous coating over surface 24 and the entire surface exposed to ultraviolet light except where contact windows 20 and 22 are desired. The KMER developer is then applied to the KMER to wash away the nonirradiated portions, where the windows are to be etched. A suitable silicon dioxide etchant such as hydrofluoric acid is then applied to the exposed oxide area to selectively etch the oxide away, and form the windows 20 and 22 to semiconductor regions 12 and 14.

The aluminum metallization pattern can be analogously formed by initially vacuum evaporating a layer of aluminum over the entire surface 24 of oxide layer 18, and then selectively etching undesired parts of the aluminum layer away. The aluminum layer can be about 8,000–25,000 angstroms thick. Undesired parts can be etched away using KMER and photomasking techniques, and a suitable etchant such as 113 grams potassium ferricyanide, 5.65 grams sodium hydroxide and 565 milliliters water. Alternately, the aluminum metallization pattern can be formed by simply vacuum evaporating aluminum through a mask onto the surface 24 of oxide layer 18.

In the next step, shown in FIG. 3, a continuous film or blanket 30 of glass is formed over the entire wafer surface except for holes 32 and 34 over their respective portions 26 and 28 of the aluminum metallization pattern. The glass film thickness can be varied considerably, for example from about 3,000 to 500,000 angstroms with 15,000 to 20,000 angstroms being preferred. A suitable glass for the film is the quartz sputtering target of Veeco Instruments, Inc., Terminal Drive, Plainview, N.Y. Conventional techniques can be used to apply the glass film as, for example, RF sputtering. Also, the glass film can be formed by applying a slurry containing powdered glass onto the wafer surface, drying the slurry to form a powdery glass film, and then firing the powder to coalesce the particles. Glass layer 30 cooperates with the silicon dioxide layer 18 to insure against degradation of the device by outside contamination.

It is preferred to form windows 32 and 34 in glass film 30 by conventional photomasking techniques using KMER and hydrofluoric acid in a manner similar to that described in making windows in the silicon layer 18.

FIG. 4 depicts the wafer after it has been subjected to the next step in the process, which is deposition of a blanket coating 40 of chromium onto the wafer surface. The blanket coating 40 is a continuous coating which completely covers the surface 42 of the glass and extends through holes 32 and 34 in glass film 30 into contact with aluminum metallization pattern portion 26 and 28. Unlike the preceding steps of the process, the chromium coating is not etched until later in the process. It serves as a current conductor for the electrodeposition of contact bumps on it over holes 32 and 34 in glass film 30. In order to electrodeposit the contact bumps on the chromium coating, plating sites are first prepared. These plating sites are the gold contact pads 44 and 46 shown in FIG. 5. The gold contact pads 44 and 46 are formed on the chromium layer 40 over holes 32 and 34 in glass layer 30. The gold contact pads can be formed by vacuum evaporation, sputtering or the like. Any technique can be used that forms a continuous and adherent gold coating in low resistance electrical communication with the chromium coating. Gold thicknesses of at least 5,000 angstroms are usually needed to obtain satisfactory pads, and thicknesses in excess of 15,000 angstroms are unnecessary and increase costs. If vacuum evaporation is used to form the gold pads, the pads can be formed by masking the surface 48 of chromium layer 40 during deposition, or evaporating the gold through a mask. On the other hand, they may be formed by depositing a blanket layer of gold onto chromium surface 48 and subsequently etching away the unwanted gold using KMER and an appropriate etchant.

It has been found that especially satisfactory results can be obtained by depositing both the chromium and the gold in immediately successive evaporations in the same vacuum chamber without interruption of the vacuum conditions while the wafer is heated to a temperature of about 200° C. Heating the wafer insures adherent low resistance coating. Successive blanket coatings of chromium and gold are thus obtained. The wafer is then removed from the vacuum chamber and the gold pads 44 and 46 defined using the aforementioned photoresist techniques with KMER and a selective gold etchant. One such selective etchant comprises 300 grams potassium iodide and 100 grams iodine per liter of water. Commercially available cyanide base etchants can be used also, such as MacDermid Metex Aurostrip 407.

The photoresist used in defining the gold pads is then removed and the wafer rinsed and dried. This leaves the blanket coating of chromium exposed on the wafer surface except for those portions covered by the gold pads.

The wafer is then immersed in a silver electroplating solution with chromium surface 48 still exposed, that is unmasked. An anode, such as a silver sheet connected to a source of positive potential, is also immersed in the electroplating solution. The wafer and anode surfaces are preferably vertically oriented parallel one another for best current distribution. The chromium layer 40 is connected to a source of negative potential and silver electrodeposits onto the gold contact pads. The silver will not deposit on the chromium coating. The chrominum coating is apparently passive with respect to the silver so that the chromium coating need not be masked. Significant thicknesses of silver can be electrodeposited onto gold pads 44 and 46 without fear that a covering mask will degenerate during plating and silver will deposit onto the exposed surface 48 of chromium layer 40. This peculiar characteristic of silver electroplating solutions is exhibited by silver cyanide electroplating solutions. One such soluton which can be used contains 80 grams silver cyanide and 100 grams potassium cyanide per liter of water. This solution is used with a voltage of about 1 to 15 volts and with currents of about 1–15 milliamperes. Wafers having only about a hundred sites upon which to deposit silver might be best deposited at a current of about 1–5 milliamperes, while if there are a thousand sites on which to deposit, a current of up to 15 milliamperes could be used. In any event, a dense, fine grained deposit of silver is desired for the contact bumps. This can be achieved at the lower currents for wafers with any number of bumps. However, it can be increased for corresponding increases in the number of bumps being plated, if desired. However, the maximum current permitted per contact bump is that at which the silver starts to deposit in a spongy nonuniform way.

It is preferred to deposit the silver using an electroplating system such as shown in connection with FIG. 8. Wafer 10 and anode 54 are shown connected to a three-way switch which is used to periodically reverse the polarity of the potential applied to the wafer and anode, as hereinafter described. A variable resistance 56 can be used to adjust the electrical current through the system along with a 1,000 ohm resistor 57. Three-way switch 58 is periodically reversed to get best uniformity in thickness among all the silver contact bumps being formed. The periodic reversal will produce a slight deplating or etching of the silver during plating, tending to remove nonuniformities. While it is preferred to use a plating cycle of 10 seconds plating time with a reverse plating or etch time of three seconds, this cycle can be altered considerably depending on the wafer and bump height, that is silver thickness, which is being plated.

The plating is continued until a sufficient bump height is achieved as for example 0.5–1.5 mil in height. The wafer can be periodically removed from the plating solution and inspected and changed during the plating, if desired. The bump width, of course, will be primarily a function of the size of the gold pad and secondarily a function of the thickness of silver deposited. Typically circular gold pads having a diameter of about 5 mils produce bump width of about 7–8 mils when the bump height is about 1.5 mil.

After sufficient silver is deposited, the wafer 10 is removed from the silver plating solution, rinsed with water and directly immersed with the wafer face vertical in a conventional gold electroplating solution without any masking. As with the silver electroplating solution, the gold will not deposit on the exposed chromium coating 40. An anode, such as a gold plated sheet of lead, is connected to a source of positive potential. The anode is also immersed in the gold electroplating solution and aligned parallel the wafer face. The chromium coating is connected to a source of negative potential and plating allowed to proceed on the silver bumps. Gold plating onto the silver bumps is continued until the bumps are completely covered with gold. An aqueous gold plating solution having the following composition can be used:

| | Grams/liter |
|---|---|
| Gold cyanide | 8 |
| Potassium cyanide | 90 |

The gold is deposited at about 2 volts and a current of about 2 milliamperes. As with electrodepositing the silver, the maximum current that can be used will vary, depending on the number of silver bumps being plated.

Only sufficient gold is deposited to provide a continuous coating over the silver bumps to isolate them from the etchant used in the next following step. In general, only a flash deposit about 0.001 to 0.1 mil of gold is required, which is deposited in about 2–4 minutes. The plating current need not be periodically reversed for producing such a thin coating.

The wafer is then removed from the gold plating solution, rinsed and directly immersed in an etchant that selectively attacks the chromium coating but not the gold. One etchant that can be used is chromium etchant type TFD, Transene Co. Another for etching chrome is potassium ferricyanide—113 grams, sodium hydroxide—5.65 grams, and 565 milliliters of water. It is maintained at a temperature of about 40° C. during etching. Other selective etchants are commercially available. No special procedures are needed before, during or after etching. One needs merely to immerse the wafer in the etchant with the chromium coating exposed. The time required to etch completely through the chromium coating will, of course, vary with the thickness of the coating. However, for a thickness of about 1,500 angstroms, the preferred etchant will completely etch through it in about 3 minutes.

It should be noted that since the etchant will not attack gold, the chromium beneath the gold plated bumps will not be etched away either. This leaves a metallization system in which a chromium pad contacts the aluminum metallization pattern through a hole in a covering glass coating. A gold pad is registered over the chromium pad. A siver bump is over the gold pad, and the silver bump is gold plated.

In this manner a multiplicity of very uniform contact bumps can be formed without any masking once the gold pads 44 and 46 have been defined.

The invention is not limited to the formation of silver contact bumps. It can also be used to form contact bumps with solder. In such instance the gold coating used to form the contact pads 44 and 46 would be replaced with a dual layer of copper and tin. The silver in contact bumps 50 and 52 would be replaced by solder containing 10% by weight tin and 90% by weight lead.

The solder bumps are formed in much the same way as the silver bumps are formed. For example, a plurality of active devices are initially formed in the semiconductor wafer 10, an oxide coating 18 formed on it and an aluminum metallization pattern deposited so as to make contact with selected areas of the devices through windows in the oxide coating. A glass coating 42 is applied over the surface and windows formed in it over portions of the aluminum metallization pattern. A blanket chromium coating of about 1,000–3,000 angstroms, preferably 1,500 angstroms, is deposited on the wafer at about 200° C.–340° C. This same thickness of chromium can be used for the preceding example of the invention too. Thin blanket layers of copper and tin are then sequentially deposited over the chromium by vacuum evaporation. It is preferred to deposit about 4,000 angstroms of copper at a substrate temperature of about 340° C. although about 3,000–10,000 angstroms can be used. It is preferred that the substrate temperature be 170° C. to deposit the tin layer. Tin layer thicknesses of about 500–2,000 angstroms can be used, with 1,000 angstroms being preferred.

The metallized wafer is then selectively masked with KMER or the like to etch through the copper and tin to define contact pads 44 and 46, as previously described in etching the gold layer. Any of the usual etchants for tin and copper, as for example aqueous ferric chloride solutions, can be used to selectively etch these metals without also etching the chromium.

After dual layer contact pads 44 and 46 have been defined by etching, the KMER is removed and the wafer rinsed. The wafer is then placed without any masking in a plating bath which deposits solder containing 10% by weight tin and 90% by weight lead. A solder plating bath such as follows can be used:

| | | |
|---|---|---|
| $Sn(BF_4)_2$ stannous fluoborate | ml | 54.56 |
| $Pb(BF_4)_2$ lead fluoborate | ml | 548.00 |
| $HBF_4$ fluoboric acid | ml | 441.60 |
| $H_3BO_3$ boric acid | gm | 58.60 |
| Peptone | gm | 1.52 |
| Water | ml | 2112 |

As in depositing the silver contact bumps, the entire surface of the wafer is exposed to the plating bath and electrical contact is made to the wafer through the exposed chromium layer. The solder will only deposit on the copper-tin contact pads. It is initially deposited for about 5 minutes at a current of about 4 milliamperes and then deposited at a slightly higher current, about 5–8 milliamperes until a sufficient bump height is achieved. Deposition is made at room temperature using air agitation of the plating solution. It has been found that a bump height of about 1–2 mils can be achieved in about 1–2 hours. Improved uniformity in bump height across the wafer surface is obtained by using a periodically reversed plating procedure along the lines of that previously described for depositing the silver. For example, cyclic reversal of the plating current for 3 seconds after each 10 seconds of plating time can be used.

After sufficient bump height has been achieved the wafer is removed from the solder plating bath and rinsed. The solder bumps can then be covered with protective metals, such as gold. In such instance the bumps would be plated in the manner previously described for gold plating the silver contact bumps.

However, we prefer not to apply a protective coating over the solder bumps and, instead, reflow the solder bump. Solder reflow can be achieved by fluxing the wafer and heating it momentarily above the melting point temperature of the solder, e.g. about 300° C. The wafer is then cooled so that the exposed chromium can then be removed. The exposed chromium is etched away using the same selective etchants previously described.

We claim:

1. A process for making contact bumps on a semiconductor chip, said process comprising the steps of:
   - forming an aluminum metallization pattern on the surface of a semiconductor wafer having at least one active device formed therein,
   - forming a blanket film of glass over said metallization pattern on said wafer, with holes in said film exposing selected contact regions of said aluminum metallization pattern,
   - applying a continuous coating of chromium on said glass film with portions of said coating in contact with said selected aluminum contact regions through said holes in said glass film,
   - forming discrete contact pads on said chromium coating over said said holes in said glass film,
   - immersing said wafer in a contact bump electroplating solution with said chromium coating and said discrete contact pads exposed to said electroplating solution,
   - connecting said exposed chromium coating to a source of negative potential to selectively electrodeposit contact bump metal onto said discrete contact pads and thereby form discrete contact bumps on said exposed chromium coating, and
   - removing said chromium coating from said surface except for selected portions beneath said contact bumps to thereby define discrete chromium pads contacting said selected region of said aluminum metallization pattern under said contact pads for said contact bumps.

2. A process for making gold plated silver contact bumps on a semiconductor chip, said process comprising the steps of:
forming an aluminum metallization pattern on the surface of a semiconductor wafer having at least one active device formed therein,
forming a blanket film of glass over said metallization pattern on said wafer, with holes in said film exposing selected contact regions of said aluminum metallization pattern,
applying a continuous coating of chromium on said glass film with portions of said coating in contact with said selected aluminum contact regions through said holes in said glass film,
forming discrete gold pads on said chromium coating over said holes in said glass film,
immersing said wafer in a silver electroplating solution with said chromium coating and said discrete gold pads exposed to said electroplating solution,
connecting said exposed chromium coating to a source of negative potential to selectively electrodeposit silver onto said discrete gold pads and thereby form discrete silver contact bumps on said exposed chromium coating,
immersing said wafer with silver contact bumps thereon in a gold electroplating solution with said silver contact bumps and said chromium coating exposed to said solution,
applying a negative potential to said chromium coating whereby gold selectively electrodeposits onto said exposed silver contact bumps without electrodepositing onto said exposed chromium coating, and
removing said chromium coating from said surface except for selected portions beneath said contact bumps to thereby define discrete chromium pads contacting said selected region of said aluminum metallization pattern under said gold pads for said silver contact bumps.

3. A process for making gold plated silver contact bumps on a monolithic semiconductor flip chip, said process comprising the steps of:
forming an aluminum metallization pattern on the surface of a semiconductor wafer having a plurality of semiconductor devices formed therein,
completely coating said wafer surface with a blanket film of glass,
etching holes through said glass film to expose selected contact regions of said aluminum metallization pattern,
evaporating a blanket coating of chromium onto said surface under vacuum conditions, with areas of said chromium coating in contact with said aluminum through said holes in said glass film,
evaporating a blanket layer of gold onto said chromium coating without interruption of said vacuum conditions,
selectively etching portions of said gold layer completely away to expose extensive portions of said chromium coating and thereby define discrete gold pads on said chromium coating over said holes in said glass film,
connecting said exposed chromium coating to a source of negative potential,
immersing said wafer in a silver electroplating solution with said portions of said chromium coating and said gold pads contacting said solution, said silver electroplating solution having an anode immersed therein also,
applying a negative potential to said chromium coating and a positive potential to said anode to selectively electrodeposit silver contact bumps onto said gold pads at a current of the order of 1–15 milliamperes, with no silver being deposited on said exposed portions of said chromium coating,
periodically reversing said potentials in a regular cycle in which the negative potential is applied to said chromium coating about three times as long as the positive potential is applied,
thereafter immersing said wafer in a gold electroplating solution with said silver contact bumps and said portions of said chromium coating contacting said solution, said solution having an anode therein,
electroplating a gold coating onto said silver contact bumps, with no gold being deposited on said exposed portions of said chromium layer, and
immersing said wafer in an etchant that selectively attacks chromium but not gold to completely etch away said exposed portions of said chromium coating and define discrete chromium pads contacting said selected regions of said aluminum metallization pattern through said holes in said glass film under the gold pads for said gold plated silver contact bumps.

4. A process for making collapsible solder contact bumps on a semiconductor chip, said process comprising the steps of:
forming an aluminum metallization pattern on the surface of a semiconductor wafer having at least one active device formed therein,
forming a blanket film of glass over said metallization pattern on said wafer, with holes in said film exposing selected contact regions of said aluminum metallization pattern,
applying a continuous coating of chromium on said glass film with portions of said coating in contact with said selected aluminum contact regions through said holes in said glass film,
forming discrete contact pads on said chromium coating over said holes in said glass film, said contact pads being a laminate of copper and tin,
immersing said wafer in a solder electroplating solution with said chromium coating and said discrete contact pads exposed to said electroplating solution,
connecting said exposed chromium coating to a source of negative potential to selectively electrodeposit solder onto said discrete contact pads and thereby form discrete solder bumps on said exposed chromium coating, and
removing said chromium coating from said surface except for selected portions beneath said contact bumps to thereby define discrete chromium pads contacting said selected region of aluminum metallization pattern under said contact pads for said solder contact bumps.

5. A process for making collapsible solder contact bumps on a monolithic semiconductor flip chip, said process comprising the steps of:
forming an aluminum metallization pattern on the surface of a semiconductor wafer having a plurality of semiconductor devices formed therein,
completely coating said wafer surface with a blanket film of glass,
etching holes through said glass film to expose selected contact regions of said aluminum metallization pattern,
evaporating a blanket coating of chromium onto said surface under vacuum conditions, with areas of said chromium coating in contact with said aluminum through said holes in said glass film,
evaporating a blanket layer of copper onto said chromium coating,
evaporating a blanket layer of tin onto said copper coating,
selectively etching portions of said copper and tin layers completely away to expose extensive portions of said chromium coating and thereby define discrete laminar copper-tin contact pads on said chromium coating over said holes in said glass film,
connecting said exposed chromium coating to a source of negative potential,
immersing said wafer in a solder electroplating solution with said portions of said chromium coating and said contact pads contacting said solution, said solder electroplating solution adapted to deposit an alloy of about 10% by weight tin and 90% by weight lead and having an anode immersed therein, applying a negative potential to said chromium coating and a positive potential to said anode to selectively electro-deposit solder contact bumps onto said contact pads at a current of the order of 1–8 milliamperes, with no solder being deposited on said exposed portions of said chromium coating, periodically reversing said potentials in a regular cycle in which the negative potential is applied to said chromium coating about three times as long as the positive potential is applied, immersing said wafer in an etchant that selectively attacks chromium but not gold to completely etch away said exposed portions of said chromium coating and define discrete chromium pads contacting said selected regions of said aluminum metallization pattern through said holes in said glass film under the contact pads for said solder contact bumps, and heating said wafer to reflow said solder contact bumps.

References Cited

UNITED STATES PATENTS

| | | | |
|---|---|---|---|
| 3,625,837 | 12/1971 | Nelson | 204—15 |
| 3,408,271 | 10/1968 | Reissmueller et al. | 204—15 |
| 1,750,418 | 3/1930 | McFarland | 204—18 R |
| 1,862,231 | 6/1930 | McFarland | 204—18 R |
| 1,996,187 | 4/1935 | Barnhart | 204—18 R |

THOMAS M. TUFARIELLO, Primary Examiner

U.S. Cl. X.R.

317—234 M